United States Patent
Cromwell et al.

(10) Patent No.: US 6,923,658 B2
(45) Date of Patent: Aug. 2, 2005

(54) SUPPORT FOR AN INTEGRATED CIRCUIT PACKAGE HAVING A COLUMN GRID ARRAY INTERCONNECT

(75) Inventors: Dan Cromwell, Penryn, CA (US); Xiang Dai, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/725,512

(22) Filed: Dec. 3, 2003

(65) Prior Publication Data

US 2005/0124185 A1 Jun. 9, 2005

(51) Int. Cl.⁷ .......................... H01R 12/00; H05K 1/00
(52) U.S. Cl. .................................. 439/71; 361/762
(58) Field of Search .................. 439/70–71, 377, 439/525–526; 361/762

(56) References Cited

U.S. PATENT DOCUMENTS

| | | | |
|---|---|---|---|
| 5,833,472 A * | 11/1998 | Bright | 439/70 |
| 6,102,711 A * | 8/2000 | Hanada et al. | 439/70 |
| 6,193,205 B1 * | 2/2001 | Wang | 248/510 |
| 6,220,870 B1 * | 4/2001 | Barabi et al. | 439/71 |
| 6,344,971 B1 * | 2/2002 | Ju | 361/704 |
| 6,563,213 B1 * | 5/2003 | Wong et al. | 257/727 |
| 6,600,661 B1 * | 7/2003 | Deeney | 361/801 |
| 6,791,184 B2 * | 9/2004 | Deeney et al. | 257/726 |
| 2003/0095392 A1 * | 5/2003 | Deeney | 361/762 |

* cited by examiner

Primary Examiner—Hae Moon Hyeon

(57) ABSTRACT

A method for mechanically supporting a integrated circuit (IC) package having a column grid array (CGA) interconnection with a printed circuit board (PCB) is provided by inserting a supporting device between the IC package and the PCB after the IC package is solder attached to the PCB. The supporting device is removably and mechanically fastened to the PCB and is designed in such a shape so that the supporting device cannot come into contact with the solder columns of the CGA to cause damage or shorting. This invention eliminates the maximum retention load constraint of the IC package and enables a wide variety of thermal solution implementations without comprising reliability.

19 Claims, 4 Drawing Sheets

```
┌─────────────────────────────┐
│                             │
│  Inserting shims between an IC │
│    package and a PCB        │
│                             │
│                      503    │
└─────────────────────────────┘

┌─────────────────────────────┐
│                             │
│ Mechanically and removably fastening │
│      the shims to the PCB   │
│                             │
│                      505    │
└─────────────────────────────┘

500
```

US 6,923,658 B2

SUPPORT FOR AN INTEGRATED CIRCUIT PACKAGE HAVING A COLUMN GRID ARRAY INTERCONNECT

TECHNICAL FIELD

The present invention relates generally to printed circuit board (PCB) technology, and, in particular, to devices that mechanically support column grid array interconnects and methods of using such devices.

BACKGROUND OF THE INVENTION

Package to board interconnection has been accomplished using many different methods over the years. The industry was initially dominated by pin-through-hole (PTH) lead attachment with "integrated circuit" packages that were rectangular in shape and had rather large leads extending from the long side of the rectangle. These devices were limited in lead count and provided very rugged interconnection between the package and the printed circuit board (PCB). PTH technology was gradually replaced by surface mount technology in order to increase the number of leads, and to improve the automation of the process for attaching the devices to the boards. In the recent years, a new packaging technology, known as "ball grid array" (BGA) technology, has been developed. A BGA package consists of a silicon chip attached to the surface of a substrate. The substrate has printed circuitry that provides interconnect points for the silicon chip on the top surface, connected by fine pitch traces to an array of pads on the bottom surface. The pads on the bottom surface have attached solder spheres that serve as the interconnect points for the package to the PCB. The BGA technology allows designs with lead counts of over 1000 input/output points. In addition to the high lead count, this technology also affords many other benefits that include ease of handling, simplified device attachment and overall cost effectiveness compared to fine pitch, perimeter leaded devices.

The BGA technology, however, has a compromised reliability in thermal cycling. A perimeter leaded device with gull wings can be subjected to many thermal cycles without encountering stresses due to thermal coefficient of expansion (TCE) mismatch between the PCB and the device. BGA packages, on the other hand, are connected to the board with a rigid structure of solder spheres (oval shaped after reflow). When the device is operated, waste heat builds up and a temperature differential between the device and the board is created. The temperature differential, as well as the differences in TCE between the device and the board, will lead to stresses in the solder sphere attachment points, which creates a high risk of fatigue failure.

One solution to the thermal stability problem is the column grid array (CGA) technology, which utilize a flexible column lead in place of the solder spheres. The column leads are designed to have a lower stiffness than a solder sphere and a higher offset distance between the device and the PCB. These two features enable the leads to flex with less stress as the dimensional expansion between the device and the PCB varies. The higher offset distance reduces the stress by the square of the distance between the device and the PCB.

CGA has been widely used in high reliability applications. However, the thin and tall solder column interconnects in CGA are susceptible to damage due to short-term dynamic load during shock, vibration, and creep under long-term static compressive load. For example, a thermal solution that is directly attached to an integrated circuit (IC) package will subject the solder columns to shock and vibration impact, as well as long-term compressive load, and therefore should have a light mass to avoid causing excessive damages to solder columns. This limitation becomes a severe problem for large and high power IC packages that need thermal solutions with a high retention load due to heat sink mass or thermal interface requirement. The high retention load often exceeds the maximum long-term compressive load of the solder columns and causes excessive creep, bending, buckling of the solder columns, which finally results in interconnect failures such as shorting or joint failure. Accordingly, the solder columns in a CGA connection often need to be mechanically supported in these applications. The supporting device also needs to be fully fastened, so that the supporting device will not get loose and cause damages by itself. Commonly used supporting devices include posts attached between heat sink and PCB, and external frame or corner support. These devices, however, often require complicated attaching process using epoxy adhesives and consume valuable PCB real estate.

SUMMARY OF THE INVENTION

Mechanical support of an IC package having a CGA interconnection with a PCB may be provided by inserting shims between the IC package and the PCB. The shims may be mechanically and removably fastened to the PCB and may be designed in such shapes that the shims can be easily inserted into the space between the IC package and the PCB, but cannot come into contact with the solder columns of the CGA to cause damage or shorting. The maximum retention load constraint of the IC package may be substantially eliminated and a wide variety of thermal solution implementations may be enabled without compromising reliability.

BRIEF DESCRIPTION OF THE DRAWINGS

Embodiments described herein are better understood in conjunction with the following drawings, in which.

DETAILED DESCRIPTION OF THE INVENTION

The following detailed description is presented to enable any person skilled in the art to make and use the embodiments described herein. For purposes of explanation, specific nomenclature is set forth to provide a thorough understanding. However, it will be apparent to one skilled in the art that the specific nomenclature is not required. Descriptions of specific applications are provided only as representative examples. Various modifications to the preferred embodiments will be readily apparent to one skilled in the art, and the general principles defined herein may be applied to other embodiments and applications. The present inventions are not intended to be limited to the embodiments shown, but are to be accorded the widest possible scope consistent with the principles and features disclosed herein.

The embodiments described herein are generally directed to devices and methods for supporting CGA solder columns of an IC package to prevent damage to the solder columns due to shock, vibration, and long-term compressive load.

With reference now to FIGS. 1 to 5, various embodiments of a supporting device will be described. As will be described in more detail below, the supporting device may be used in a variety of configurations to provide mechanical support for CGA solder columns on an IC package.

Figure 1:
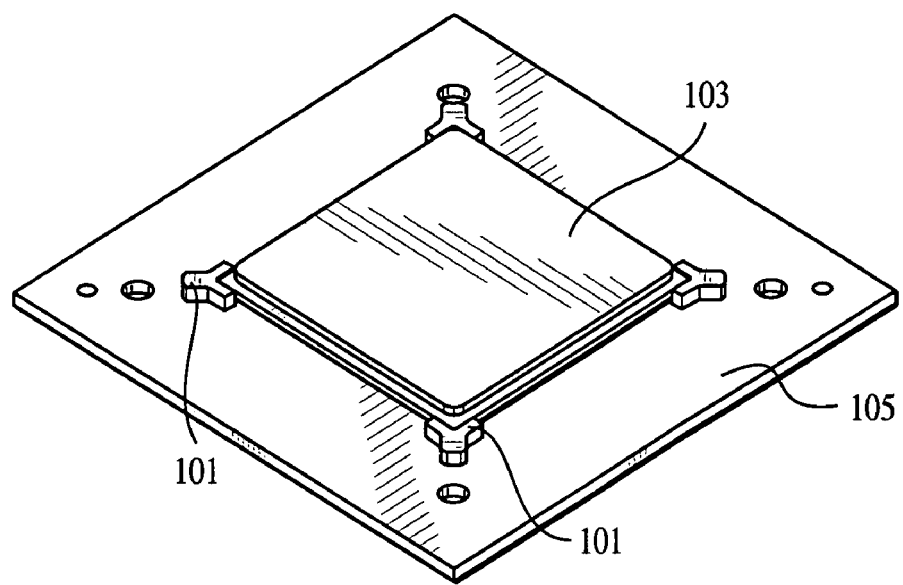
FIG. 1 is a top view of an IC package supported by supporting devices of the embodiments described herein.
Figure 2:
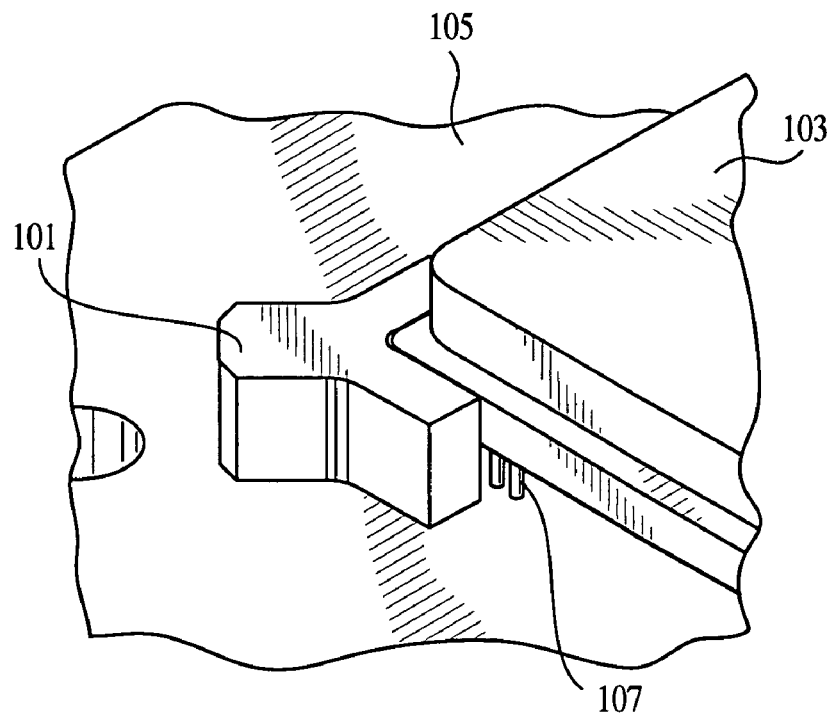
FIG. 2 is an isometric view of one corner shim of the embodiments described herein.

FIG. 1 shows an embodiment of the supporting device. In this embodiment, the supporting device is in the form of a corner shim 101. In one embodiment, the supporting device may have a Y shape. The shim 101 can be made of any material that is mechanically strong enough to support an application specific integrated circuit (ASIC) 103. Examples of the shim material include, but are not limited to, plastics, ceramics, metal, and metal alloy. Preferably, the shim 101 is made of a material with a coefficient of thermal expansion (CTE) that closely matches the CTE of the solder columns. A shim 101 with a matching CTE may be preferred in high temperature applications such as a burn-in test of semiconductor wafers and high power IC packages. In this embodiment, a shim 101 is placed at each corner of the ASIC 103. However, it is understood that the number of shims used in a particular application may vary according to the particular requirement of the application, and that the shims 101 may be placed in other depopulated areas. For example, the shims 101 may be placed along the sides of the ASIC 103, if there are depopulated areas along the side of the ASIC 103 that allow the insertion of the shim 101. Preferably, the PCB 105, ASIC 103 and shims 101 are designed to accommodate each other so that shim installation can be automated.

Figure 3A:
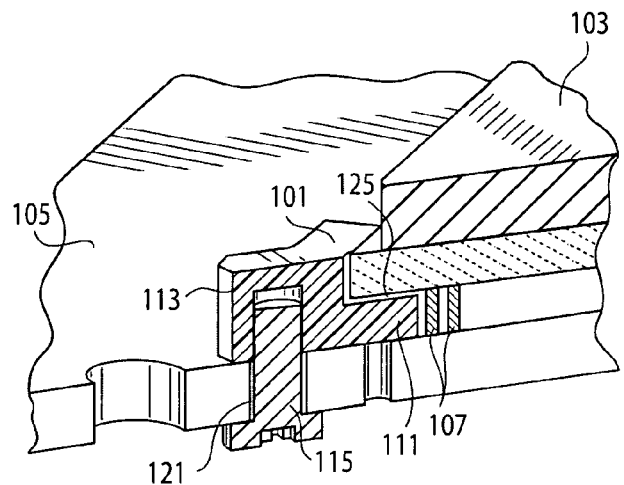
FIGS. 3a, 3b, and 3c depict three embodiments of fastening a shim to a PCB with a screw.
Figure 3B:
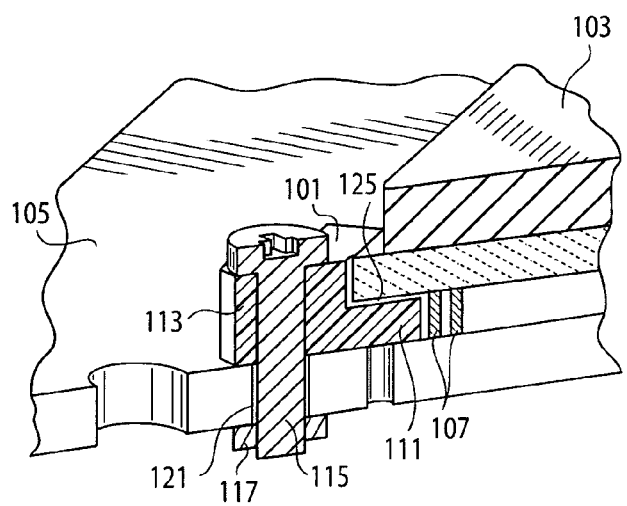
Figure 3C:
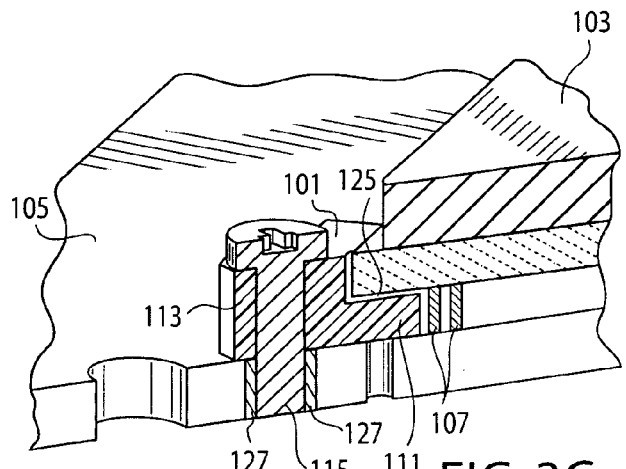
Figure 4A:
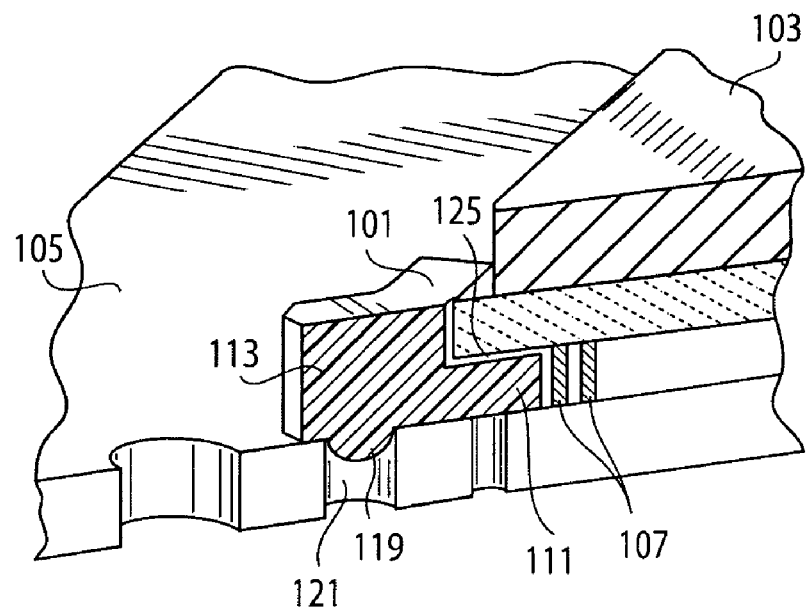
FIGS. 4a and 4b depict an embodiment of fastening a shim to a PCB with a dimple.
Figure 4B:
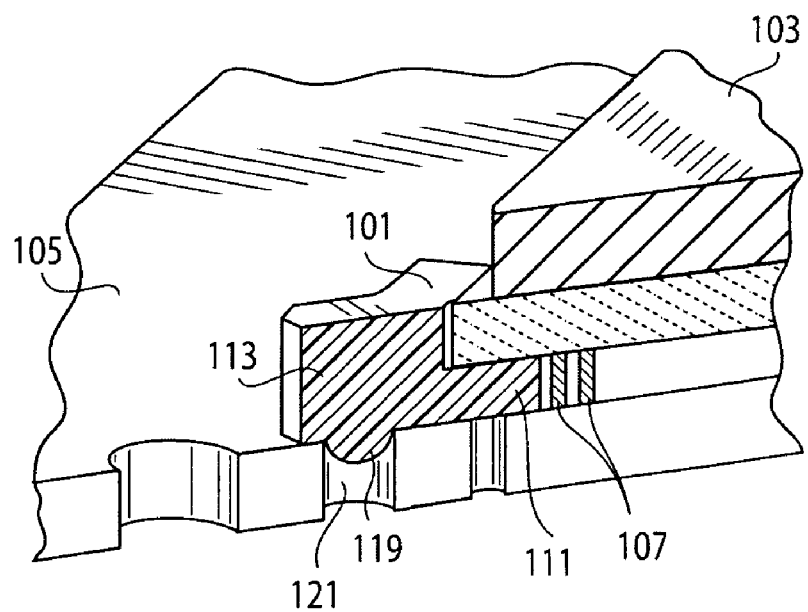

There is no particular limitation on the size and shape of the shim 101. Generally, the size of the shim 101 is minimized to reduce consumption of PCB real estate. In the embodiments shown in FIGS. 2 and 3, the shims 101 are designed in such a shape that an extrusion 111 of the shim 101 can be inserted into the space between the underside of the ASIC 103 and the topside of the PCB 105. The extrusion 111 may have a thickness that is smaller than the distance between the ASIC 103 and the PCB 105, so that the extrusion 111 may be slipped into the space between the ASIC 103 and the PCB 105 without stretching the solder columns 107. However, the extrusion 111 may be thick enough to provide mechanical support to the ASIC 103 and prevent shorting or joint failure due to creeping of the solder columns 107 under a long-term compressive load. In other words, there is preferably a small gap 125 between the extrusion 111 and the ASIC 103 immediately after the shim 101 is installed (FIG. 4A). As shown in FIG. 4B, when the apparatus is in use, the solder columns 107 will start to creep over time due to stress and the gap 125 will be closed. When the upper surface of the extrusion 111 comes into contact with the undersurface of the ASIC 103, the ASIC 103 is fully supported by the shims 101 and the stress on the solder columns 107 is relaxed.

The shim 101 may also be designed in such a shape that, after being fully inserted between the ASIC 103 and the PCB 105, the extrusion 111 of the shim 101 will not come into contact with any of the solder columns 107 of the ASIC 103. In the embodiments shown in FIGS. 2 and 3, this goal is achieved by the design of a base 113, which would come into contact with the edges of the ASIC 103 and stop the advance of the shim 101 before the extrusion 111 comes into contact with any of the solder columns 107.

In order to prevent any undesired movement of the shim 103, the shim 103 may be mechanically and removably fastened to the PCB 105. The shim 103 may be fastened to the PCB with a screw or with a snap-and-catch mechanism such as a dimple 119. FIGS. 3a to 4b illustrate several embodiments of the fastening mechanism. With reference now to FIG. 3a, the shim 101 is fastened by a screw 115 from the bottom of the base 113 through a hole 121 on the PCB 105. Alternatively, the screw 115 may be installed from the top of the base 113, through the base 113, through the hole 121, and into a bolster 117 underneath the PCB 105 (FIG. 3b). In another embodiment, a threaded adaptor 127 is inserted into the hole 121 to convert the unthreaded hole 121 into a threaded hole for the installation of the shim 101 (FIG. 3c).

With reference now to FIG. 4a, the shim 101 is pushed into a position so that the dimple 119 on the base 113 of the shim 101 clicks into the hole 121 on the PCB 105 and immobilizes the shim 101. The dimple 119 does not have to have a tight fit with the hole 121, so long as horizontal movement of the shim 101 is restricted by the dimple 119 and the matching hole 121 and so that the shim 101 cannot come into contact with the solder columns 107. Since the vertical movement of the shim 101 is restricted by the extrusion 111 in between the ASIC 103 and the PCB 105, the shim 101 is properly secured on the PCB 105. Over time, when the gap 125 is closed due to minor creeping of the solder columns 107 (FIG. 4B), the shim 101 will be completely immobilized. It should be noted, however, that the shim 101 can be removed at any time and reinstalled at the same or different location.

Figure 5:
FIG. 5 is a flow chart depicting a method of using the supporting device of the embodiments described herein.

FIG. 5 depicts a method 500 for mechanically supporting an IC package having a CGA interconnection with a PCB. The method 500 preferably comprises the steps of inserting shims between the IC package and the PCB (step 503), and fastening the shims to the PCB to secure the support to the IC package and prevent damage to the solder columns of the IC package by undesired movement of the shims (step 505). Preferably, the shims are inserted after the IC package is solder attached to the PCB, so that the presence of the shims will not interfere with the soldering process. Shims 101 may be removed for rework of the ASIC 103 and reinstalled after the rework of the ASIC 103.

The preferred embodiments of the supporting device of the present invention are intended to be illustrative and not limiting. It should be understood that modifications and variations can be made by persons skilled in the art in light of the above teachings. Therefore, changes may be made in the particular embodiments disclosed which are within the scope of what is described as defined by the appended claims.

What is claimed is:

1. A supporting device for an integrated circuit package having a column grid array interconnection with a printed circuit board, said supporting device comprising:
    a shim that is inserted between the integrated circuit package and the printed circuit board,
    wherein said shim is mechanically and removably fastened to the printed circuit board and wherein said shim has a Y shape.

2. The supporting device of claim 1, wherein the shim comprises an extrusion that is inserted between the integrated circuit package and the printed circuit board, and a base that comprises a fastening means to secure the shim to the printed circuit board.

3. The supporting device of claim 2, wherein the base and the extrusion are shaped to prevent the extrusion from to coming into contact with a solder column of the integrated circuit package.

4. The supporting device of claim 3, wherein the extrusion is designed to provide a gap between the extrusion and the integrated circuit package immediately after the installation of the supporting device.

5. The supporting device of claim 1, wherein the supporting device is installed on a corner of the integrated circuit package.

6. The supporting device of claim 1, wherein the supporting device is made of a material having a coefficient of thermal expansion that matches coefficients of thermal expansion of solder columns of the integrated circuit package.

7. The supporting device of claim 2, wherein the fastening means is a screw.

8. The supporting device of claim 2, wherein the fastening means is a dimple.

9. A method for mechanically supporting an integrated circuit package having a column grid array interconnection with a printed circuit board, said method comprising:
inserting one or more supporting devices between the integrated circuit package and the printed circuit board; and
mechanically and removably fastening the one or more supporting devices to the printed circuit board, wherein the one or more supporting devices have a Y shape.

10. The method of claim 9, wherein the inserting inserts one or more supporting devices between the integrated circuit package and the printed circuit board after the integrated circuit package is solder attached to the printed circuit board.

11. The method of claim 10, wherein the inserting positions the one or more supporting devices so that there is a gap between a top surface of the one or more supporting devices and an under surface of the integrated circuit package.

12. The method of claim 9, wherein the fastening fastens the one or more supporting devices on one or more corners of the integrated circuit package.

13. The method of claim 9, wherein the fastening fastens the one or more supporting devices to the printed circuit board by screws.

14. The method of claim 9, wherein the fastening fastens the one or more supporting devices to the printed circuit board by dimples.

15. A supporting device comprising:
a shim that is inserted between an integrated circuit package and a printed circuit board, wherein the shim is mechanically and removably fastened to the printed circuit board and wherein the shim is installed on a corner portion of the integrated circuit package.

16. The supporting device of claim 15, wherein the shim comprises an extrusion that is inserted between the integrated circuit package and the printed circuit board, and a base that comprises a fastening means to secure the shim to the printed circuit board.

17. The supporting device of claim 16, wherein the extrusion is designed to provide a gap between the extrusion and the integrated circuit package immediately after the installation of the supporting device.

18. The supporting device of claim 15, wherein the shim has a Y shape.

19. The supporting device of claim 15, wherein the fastening means is a screw.

* * * * *